(12) United States Patent  (10) Patent No.: US 7,836,419 B1
McGaughy et al.  (45) Date of Patent: Nov. 16, 2010

(54) METHOD AND SYSTEM FOR PARTITIONING INTEGRATED CIRCUITS

(75) Inventors: Bruce W. McGaughy, Fremont, CA (US); Jun Kong, San Jose, CA (US)

(73) Assignee: Cadence Design Systems, Inc, San Jose, CA (US)

( * ) Notice: Subject to any disclaimer, the term of this patent is extended or adjusted under 35 U.S.C. 154(b) by 923 days.

(21) Appl. No.: 11/390,574

(22) Filed: Mar. 27, 2006

Related U.S. Application Data

(60) Provisional application No. 60/666,017, filed on Mar. 28, 2005.

(51) Int. Cl.
*G06F 17/50* (2006.01)

(52) U.S. Cl. .............................. 716/7; 703/14
(58) Field of Classification Search ...................... 716/7; 703/14
See application file for complete search history.

(56) References Cited

U.S. PATENT DOCUMENTS

| | | | | |
|---|---|---|---|---|
| 5,305,229 | A * | 4/1994 | Dhar | 703/14 |
| 6,499,129 | B1 * | 12/2002 | Srinivasan et al. | 716/4 |
| 6,577,992 | B1 * | 6/2003 | Tcherniaev et al. | 703/14 |
| 6,588,000 | B2 * | 7/2003 | Gutwin et al. | 716/7 |
| 6,851,095 | B1 * | 2/2005 | Srinivasan et al. | 716/4 |
| 7,047,510 | B1 * | 5/2006 | Chopra et al. | 716/7 |
| 7,171,347 | B2 * | 1/2007 | Khaira et al. | 703/15 |
| 7,181,383 | B1 * | 2/2007 | McGaughy et al. | 703/14 |
| 7,324,363 | B2 * | 1/2008 | Kerns et al. | 365/63 |
| 7,340,698 | B1 * | 3/2008 | Srinivasan et al. | 716/4 |
| 7,359,843 | B1 * | 4/2008 | Keller et al. | 703/2 |
| 2001/0010090 | A1 * | 7/2001 | Boyle et al. | 716/2 |
| 2008/0140379 | A1 * | 6/2008 | Shah et al. | 703/14 |

OTHER PUBLICATIONS

Cadence Design Systems, Inc. (Sep. 2003). "UltraSim™ User Guide," Cadence Design Systems User Manual Product Version 3.3, 212 pages.
Gross, J. et al. (1999). *Graph Theory and It's Applications*, Rosen, K.H. ed., CRC Press: Bocca raton, FL, 3 pages, (Table of Content Only.).
Saleh, R. et al. (1994). *Mixed-Mode Simulation and Analog Multilevel Simulation*, Allen, J. ed., Kluwer Academic Publishers: Norwell, MA, pp. v-viii, (Table of Contents Only).

* cited by examiner

*Primary Examiner*—Vuthe Siek
*Assistant Examiner*—Patrick Sandoval
(74) *Attorney, Agent, or Firm*—Wheelock Chan LLP; Thomas Chan

(57) ABSTRACT

Method and system for partitioning integrated circuits are disclosed. The method includes receiving a netlist representation of the circuit comprising circuit components, partitioning the circuit to form one or more circuit partitions according to a predefined partitioning method, where each circuit partition includes one or more circuit components. The method further includes, for each circuit partition, identifying substantial correlations between the circuit partition and one or more other circuit partitions to form a spanning tree, where the spanning tree connects the circuit partition to the one or more other circuit partitions via a graph, and merging the circuit partition and the one or more other circuit partitions in the spanning tree to form a new circuit partition.

27 Claims, 8 Drawing Sheets

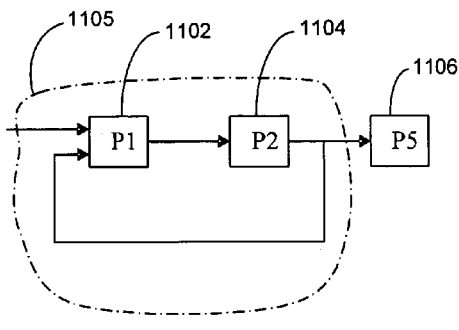
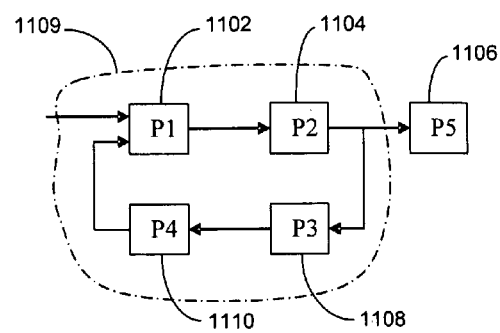
Figure 11A    Figure 11B
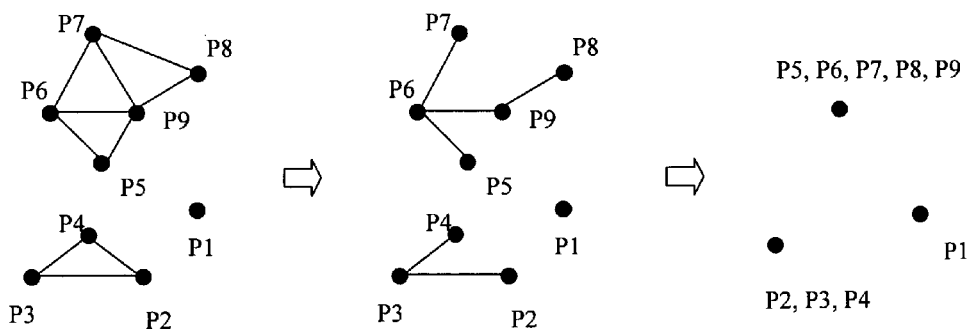
Figure 12

METHOD AND SYSTEM FOR PARTITIONING INTEGRATED CIRCUITS

CROSS-REFERENCE TO RELATED APPLICATIONS

This application claims the benefit of application No. 60/666,017, entitled "Method and System for Partitioning Integrated Circuits" filed Mar. 28, 2005, which is incorporated herein in its entirety by reference.

FIELD OF THE INVENTION

The present invention relates to the field of electronic design automation tools. In particular, the present invention relates to a method and system for partitioning integrated circuits.

BACKGROUND OF THE INVENTION

The development of complicated integrated circuits often requires powerful numerical simulation programs. For example, circuit simulation is an essential part in the design flow of integrated circuits, helping circuit designers to verify the functionality and performance of their designs without going through expensive fabrication processes. Examples of electronic circuit simulators include the Simulation Program with Integrated Circuit Emphasis (SPICE) developed at the University of California, Berkeley (UC Berkeley), and various enhanced versions or derivatives of SPICE, such as SPECTRE, developed by Cadence Design Systems, Inc. SPICE and its derivatives or enhanced versions will be referred to hereafter as SPICE circuit simulators, or SPICE.

An integrated circuit is a network of circuit elements such as resistors, capacitors, inductors, mutual inductors, transmission lines, diodes, bipolar junction transistors (BJT), junction field effect transistors (JFET), metal-oxide-semiconductor field effect transistors (MOSFET), metal-semiconductor field effect transistors (MESFET), thin-film transistors (TFT), etc. SPICE models a circuit in a node/element fashion, i.e., the circuit is regarded as a collection of various circuit elements connected at nodes. At the heart of SPICE is the so-called Nodal Analysis, which is accomplished by formulating nodal equations (or circuit equations) in matrix format to represent the circuit and by solving these nodal equations. The circuit elements are modeled by device models, which produce model results that are represented in the circuit equations as matrices.

A device model for modeling a circuit element, such as the SPICE model for modeling MOSFET devices, developed by UC Berkeley, typically includes model equations and a set of model parameters that mathematically represent characteristics of the circuit element under various bias conditions. For example, a circuit element with n terminals can be modeled by the following current-voltage relations:

$$I_i = f_i(V_1, \ldots, V_n, t) \text{ for } i=1, \ldots, n,$$

where $I_i$ represents the current entering terminal I; $V_j$ ($j=1, \ldots, n$) represents the voltage or terminal bias across terminal j and a reference terminal, such as the ground; and t represents the time. The Kirchhoff's Current Law implies that the current entering terminal n is given by $$I_n = \sum_{i=1}^{n-1} I_i.$$

A conductance matrix of the circuit element is defined by:

$$G(V_1, \ldots, V_n, t) := \begin{pmatrix} \frac{\partial f_1}{\partial V_1} & \cdots & \frac{\partial f_1}{\partial V_n} \\ \vdots & \ddots & \vdots \\ \frac{\partial f_n}{\partial V_1} & \cdots & \frac{\partial f_n}{\partial V_n} \end{pmatrix}.$$

To model the circuit element under alternating current (AC) operations, the device model also considers the relationship between node charges and the terminal biases:

$$Q_i = q_i(V_1, \ldots, V_n, t) \text{ for } i=1, \ldots, n.$$

where $Q_i$ represents the node charge at terminal i. Thus, the capacitance matrix of the n-terminal circuit element is defined by $$C(V_1, \ldots, V_n, t) := \begin{pmatrix} \frac{\partial q_1}{\partial V_1} & \cdots & \frac{\partial q_1}{\partial V_n} \\ \vdots & \ddots & \vdots \\ \frac{\partial q_n}{\partial V_1} & \cdots & \frac{\partial q_n}{\partial V_n} \end{pmatrix}.$$

A complex integrated circuit may contain millions of circuit elements such as transistors, resistors, and capacitors. The design and simulation of such a complex integrated circuit may involve multiple teams of engineers. It is advantageous to partition the design of such complex integrated circuit using a hierarchical approach, whereby certain circuit elements are grouped together and may be reused repeatedly through the integrated circuit or in a subsequent design. A method and system for design and simulation of an integrated circuit with a hierarchical data structure are disclosed by U.S. patent application Ser. No. 10/724,277, entitled "System and Method for Simulating a Circuit Having Hierarchical Structure," which, filed on Nov. 26, 2003, and commonly owned by Cadence Design Systems, Inc., is incorporated expressly by reference in its entirety herein.

As the number of circuit components of a System-on-Chip (SoC) integrated circuit continues to increase, the convention SPICE simulation fails to meet the simulation demand of such SoC integrated circuit due to speed and capacity limitations. One problem is that the SPICE simulation has become a time-consuming process for many practical applications. Another problem is that the SPICE simulation may run out of computer memory before completion of the simulation, which leads to waste of valuable resources and time.

A Fast SPICE circuit simulator attempts to improve the speed and memory usage of the SPICE circuit simulator while maintaining accuracy of the simulation. One example of a commercial Fast SPICE circuit simulator is the Virtuoso Ultrasim Fast SPICE circuit simulator developed by Cadence Design Systems, Inc. One improvement of the Fast SPICE circuit simulator over the conventional SPICE circuit simulator is the ability to identify and simulate the multi-rate characteristics of a large integrated circuit. It is well known that many large integrated circuits may demonstrate the multi-rate characteristics. That is, at a particular point in time, some portions of the circuit may have high rate of activities, while other portions may not have any activities at all. For example, when one portion of a direct random access memory (DRAM) is being accessed, other portions of the DRAM are typically in idle state. The computational cost of inactive portions may be reduced significantly by using circuit partitioning and multi-rate simulation.

Thus, using a Fast-SPICE simulator along with circuit partitioning techniques would address some of the issues of the conventional SPICE simulator. In a conventional circuit partitioning technique, an integrated circuit is divided into a set of regions formed by directly-coupled or channel-connected elements. A partition usually consists of some transistors topologically connected together through their sources or drains. Examples of circuit partition techniques are described in "Mixed-mode Simulation and Analog Multilevel Simulation," by Saleh, Resve A., Kluwer Academic Publishers, 1994, pp. 93. A Fast-SPICE simulation of a partition is triggered only when there is an event at its input, for example, when the voltage at the input node changes more than a predefined threshold.

However, the traditional partitioning techniques based on channel connection partitioning are insufficient for addressing complex direct-coupling, indirect-coupling, or non-topological-coupling effects of sub-micron integrated circuit designs. Therefore, there is a need for a new method and system for partitioning sub-micron integrated circuits for Fast SPICE simulation.

SUMMARY

In one embodiment, a method for preparing a circuit for simulation includes receiving a netlist representation of the circuit comprising circuit components, partitioning the circuit to form one or more circuit partitions according to a predefined partitioning method, where each circuit partition includes one or more circuit components. The method further includes, for each circuit partition, identifying substantial correlations between the circuit partition and one or more other circuit partitions to form a spanning tree, where the spanning tree connects the circuit partition to the one or more other circuit partitions via a graph, and merging the circuit partition and the one or more other circuit partitions in the spanning tree to form a new circuit partition.

In another embodiment, a system for preparing a circuit for simulation includes at least one processing unit for executing computer programs, a graphical-user-interface for viewing representations of the integrated circuit on a display, and a memory for storing information of the integrated circuit. The system also includes logic for receiving a netlist representation of the circuit comprising circuit components, logic for partitioning the circuit to form one or more circuit partitions according to a predefined partitioning method, where each circuit partition includes one or more circuit components. The system further includes, for each circuit partition, logic for identifying substantial correlations between the circuit partition and one or more other circuit partitions to form a spanning tree, where the spanning tree connects the circuit partition to the one or more other circuit partitions via a graph, and logic for merging the circuit partition and the one or more other circuit partitions in the spanning tree to form a new circuit partition.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

FIG. 11A illustrates a circuit with a feedback loop according to an embodiment of the present invention.

FIG. 11B illustrates a circuit with a different feedback loop according to an embodiment of the present invention.

FIG. 12 illustrates a graphical representation of merging a group of graphs to their corresponding circuit partitions according to an embodiment of the present invention.

DESCRIPTION OF EMBODIMENTS

Methods and systems are provided for partitioning integrated circuits. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

Figure 1:
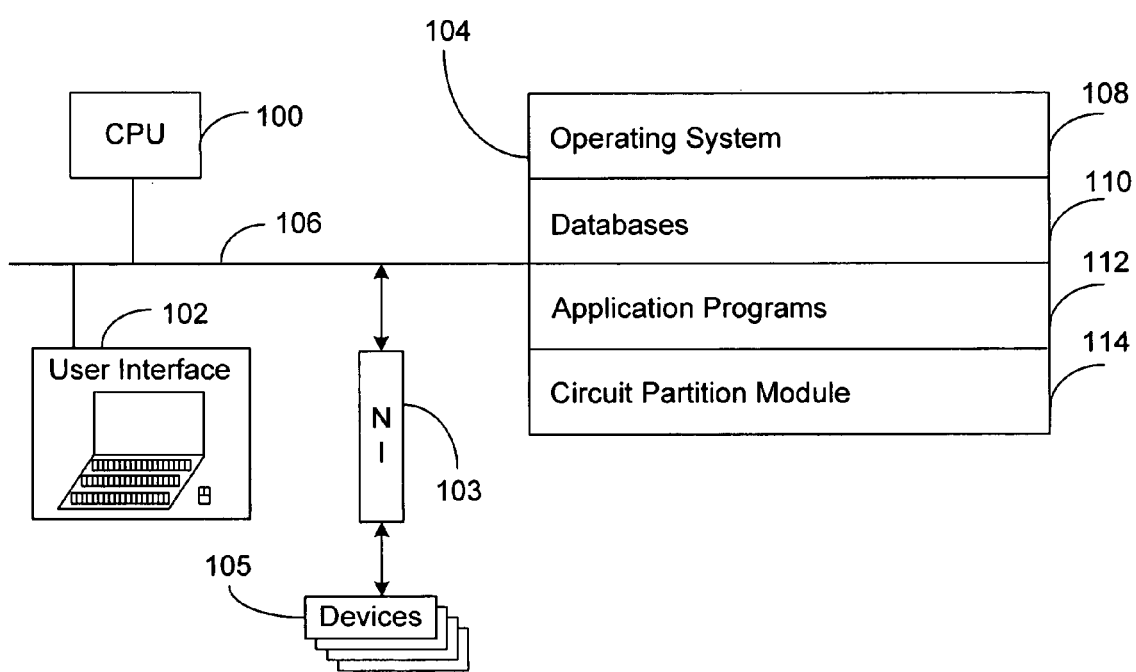
FIG. 1 illustrates an implementation of a circuit partition module using a computer system according to an embodiment of the present invention.

In one embodiment, a circuit partition module is implemented using a computer system schematically shown in FIG. 1. The computer system includes one or more central processing units (CPUs) 100, at least a user interface 102, a memory device 104, a system bus 106, and one or more bus interfaces for connecting the CPU, user interface, memory device, and system bus together. The computer system also includes at least one network interface 103 for communicating with other devices 105 on a computer network. In alternative embodiments, much of the functionality of the circuit simulator may be implemented in one or more application-specific integrated circuits (ASICs) or field-programmable gate arrays (FPGAs), thereby either eliminating the need for a CPU, or reducing the role of the CPU in generating the initial layout of the integrated circuit.

The memory device 104 may include high-speed random-access memory and may also include non-volatile memory, such as one or more magnetic disk storage devices. The memory device 104 may also include mass storage that is remotely located from the CPU(s) 100. The memory device 104 preferably stores:

an operating system 108 that includes procedures for handling various basic system services and for performing hardware-dependent tasks;
databases 110 for storing information of the integrated circuit;
application programs 112 for performing other user-defined applications and tasks; and
a circuit partition module 114 for evaluating design costs of an integrated circuit.

The database 110, the application programs 112, and the circuit partition module 114 may include executable procedures, sub-modules, tables, and other data structures. In other embodiments, additional or different modules and data structures may be used, and some of the modules and/or data structures listed above may not be used.

There are many types of indirect-coupling. For example, for a current-controlled-current-source, there is a strong coupling between the controlled current source and the controlling source, although there is no channel-connection between them. In fact, they can be far away in the circuit from each other. Since they are not channel-connected to each other, the conventional partitioning technique separates them into different partitions.

The separation of indirectly-coupled components (elements or nodes) into different partition may cause two serious problems: 1) the accuracy may be severely degraded because they are put into different matrices in simulation; and 2) the indirect but yet strong coupling between the two components introduces frequent communications between the two partitions, and such communications can cause a large number of iterations during simulation when the matrices are solved. Thus, the communications between partitions can dominate the computation time over the time for solving the matrices, which results in slower simulation speed.

In one embodiment, to address the above problem, the indirectly-coupled components, either element or node, are put into the same partition. In this way, the communications between the two partitions are significantly reduced. In one approach, the method considers the indirect-coupling during the partitioning process, and puts the coupled components into the same partition. The correlated elements or nodes may be topologically far away in the circuit. The situation may be even worse if there is a cluster of indirectly-coupled components. For example, component A is coupled to component B, while component B is coupled to component C, component C is in turn coupled to D, and so on. In this situation, the method brings all coupled components together, and forms a single large partition comprising the coupled components.

Figure 2:
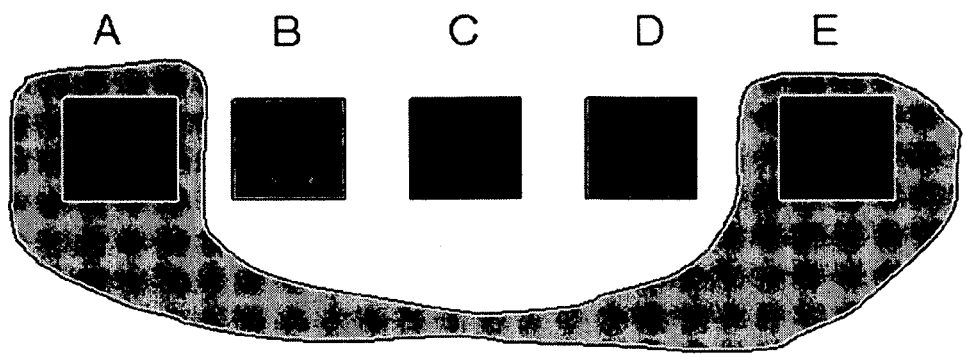
FIG. 2 illustrates an example of indirectly-coupled components in five partitions according to an embodiment of the present invention.

In an alternative approach, the method first performs an aggressive partitioning, and then merges those components that are correlated to each other. For example, as shown in FIG. 2, the method first aggressively cuts the connections between the indirectly-coupled components into five small partitions. After the partitioning step, the method merges partitions that are correlated. In this example, partitions A and E are merged because they are correlated. However, the small partitions between A and E, such as partitions B, C, and D, remain separated. As a result, the method not only ensures simulation accuracy, at the same time it keeps the size of the partitions reasonably small, and thus it achieves the benefits of both simulation accuracy and performance.

In another embodiment, a method for performing graph based partition-merging technique is described. In one approach, each partition is a vertex in the partition-merging graph. When two partitions are indirectly-coupled to each other, an edge between the two vertices is added in the graph. After building up the complete partition-merging graph, a spanning forest comprising one or more spanning trees is built based on a depth-first search (DFS) technique. Then each tree among the forest is called a merging cluster of partitions. All partitions in the merging cluster are merged into a single partition.

Note that a spanning tree of a connected, undirected graph is a tree composed of all vertices and some edges of that graph. In general, a spanning tree of a graph is a selection of edges from the graph that form a tree spanning every vertex; that is, each vertex is connected to the tree. A spanning forest of an arbitrary graph, including an unconnected undirected graph, is a forest that includes every vertex of the graph and contains a subset of edges of the graph, which does not change connected components.

Note that a DFS is an algorithm for traversing or searching a tree, tree structure, or graph. Intuitively, one starts at the root (selecting some node as the root in the graph case) and explores as far as possible along each branch before backtracking. In general, DFS is an uninformed search that progresses by expanding the first child node of the search tree that appears and thus going deeper and deeper until a goal node is found, or until it hits a node that has no children. Then the search backtracks, returning to the most recent node it has not finished exploring. In a non-recursive implementation, all freshly expanded nodes are added to a last-in-first-out (LIFO) queue/stack for expansion.

The partition-merging processes are designed as a base class and a number of derived classes. The base class incorporates the flow for the partition-merging processes. Most of the information goes into the base class except the coupling identification. On the other hand, the derived classes implement the indirect-coupling identification processes, and the identification processes may be different from each other, according to the indirect-coupling effects.

Figure 3:
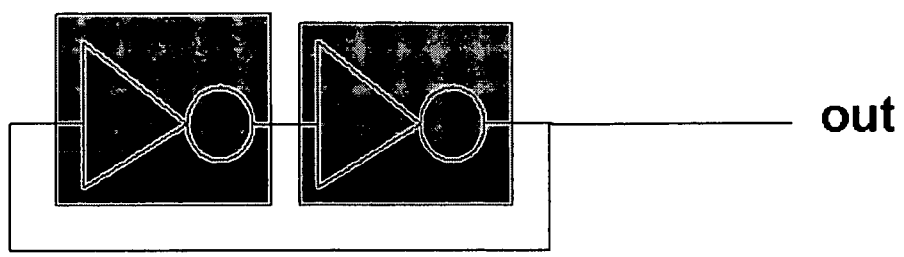
FIG. 3 illustrates an example of gate-coupling in a flip-flop implemented with a two-inverter chain according to an embodiment of the present invention.

FIG. 3 illustrates an example of gate-coupling in a flip-flop implemented with a two-inverter chain. A conventional partition technique would separate the two inverters into two partitions, and would not consider the strong coupling between the two inverters, as each inverter takes the output of another one as its own input.

When the two inverters are separated into two partitions, the simulation accuracy may be degraded, and the convergence of the simulation may also be slowed down because of the heavy communications between the two partitions.

A gate-coupling condition occurs when two partitions are said to be gate-coupled to each other, if each partition has a MOSFET element with gate terminal residing in another partition. In other words, the two partitions form an input-output loop.

In yet another embodiment, a method for identifying a gate-coupling condition is as follows: First, a MOSFET gate-partition to drain/source-partition map is built. This map is also referred to as a G map. If a partition A is G mapped to another partition B, then partition B has a MOSFET element whose gate terminal is residing in partition A. If two partitions A and B are G mapped to each other, then they are gate-coupled.

Upon identifying all the gate-coupling components, the partition-merging process is performed in the base class as follows: 1) form the merging graph; 2) build the forest; and 3) take each tree among the forest as a merging cluster, and merge all the partitions in a cluster into one single partition.

In yet another embodiment, a method for identifying dependent elements coupling and performing partition-merging are described. If two elements are dependent on each other (e.g. mutual inductors or current-controlled-current-source), but they are separated in two different partitions, then the simulation accuracy may be severely affected.

The steps for identifying and processing this type of coupling are: 1) find the pair of dependent elements; and 2) if they are in different partitions, add an edge in the partition-merging graph between the two partition vertices. The merging process takes place in the base class.

In yet another embodiment, a method for identifying dependent element-node coupling and performing partition-merging are described. In an integrated circuit design, some elements may depend on certain nodes. For example, for a voltage-controlled-voltage-source, the controlled voltage source as an element depends on two nodes, which are the two terminals of the controlling voltage source.

The steps for identifying and processing this type of coupling are: 1) find the elements and nodes that are coupled and depend on each other; and 2) add an edge in the merging graph accordingly. The merging process takes place in the base class.

In yet another embodiment, a method for identifying strongly-coupled-node (SCN) coupling and performing partition-merging are described. In an integrated circuit design, the MOSFET gate and drain or gate and source may be strongly coupled to each other, for example, when the gate to drain or gate to source capacitance is large.

In this situation, the method provides the user an option to set a node to be a SCN when the user determines that the gate and drain or gate and source are strongly coupled.

The steps for identifying and processing the SCN coupling are: 1) for any user-set SCN node, find partition A that is the owner of the SCN node; 2) find each MOSFET element whose gate terminal is the SCN node; and 3) add an edge between partition A and the partition that owns the MOSFET element. The merging process takes place in the base class.

In yet another embodiment, a method for identifying analog elements and performing partition-merging are described. In some situations, a user may determine that some analog elements need higher accuracy in simulation. If two partitions are topologically connected, and both partitions contain some elements with the higher accuracy requirement, then the simulation accuracy increases if the two partitions are merged to form a single matrix. The steps for identifying an analog element and performing partition-merging are described below.

Pre-process-I: determine a set of analog partitions; get each analog element that has an accuracy requirement and find its partition; and put that partition into an analog partition set. As a result, every partition in the analog partition set has at least one analog element that requires a higher accuracy.

Pre-process-II: for each partition in the analog partition set, add a graph edge between the partition and each of its input nodes' partitions if the input node's partition is also in the analog partition set. For example, two partition vertices has graph edges between them if and only if both have analog element with higher accuracy requirements and the two partitions are topologically connected through input port or output port nodes.

Finally, the merging process takes place in the base class: build forest, merge all the partitions in each tree into a single larger partition. All the topologically connected and accuracy-demanding partitions are merged.

In yet another embodiment, a method for performing on-switch partition-merging is described. The dynamic partitioning technique in a hierarchical simulator is a process to optimize the matrices for solving a group of partitions. The method examines the strength of coupling (connectivity) between partitions.

There are two main factors in determining whether it is more efficient to compute each partition individually or combine the partitions together in a larger matrix: 1) the size of the matrix; and 2) the number of computational iterations required for the simulation solution to converge. Generally, a large matrix requires more computation cycles to solve than a small matrix. However, if two partitions are closely coupled, frequent communications between the partitions may result in much computational iteration during simulation. Under such circumstance, the simulator may need to monitor, generate, and communicate changes in signal conditions from one partition to the other partition repetitively until a solution converges. The Newton-Raphson iteration is one technique that may be used for this repetitive simulation process. In other words, if two partitions are tightly coupled to each other, it may be more efficient to combine them together and simulate them in a large matrix because the external communications of changes in signal conditions and their corresponding simulation iterations are eliminated. On the other hand, if two partitions are loosely coupled to each other, it may be more efficient to simulate them separately in their respective matrices because the simulator may work with smaller matrices, and the simulator may take a different time step for each circuit best suited for reaching a solution.

Figure 4:
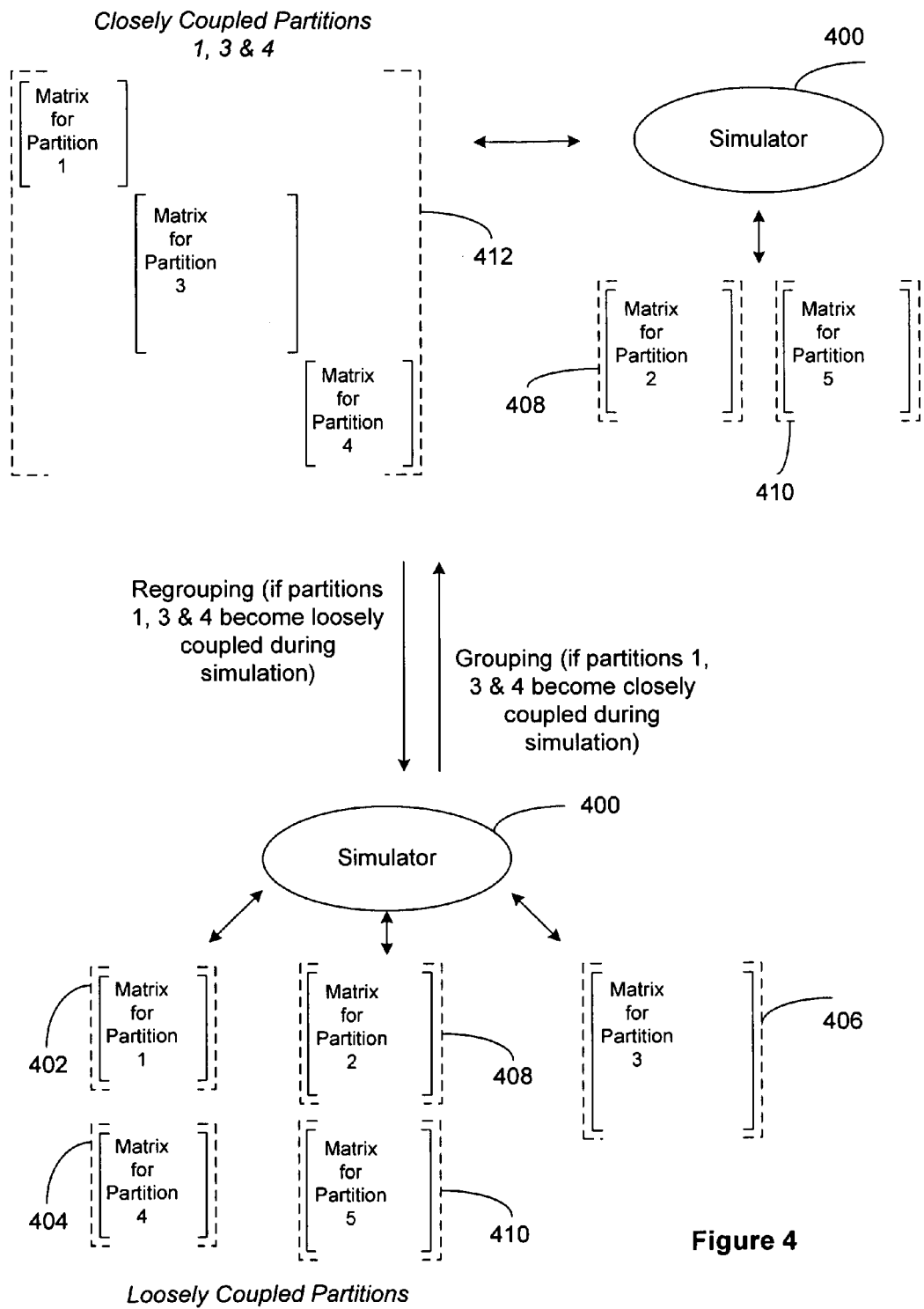
FIG. 4 illustrates a dynamic partitioning method in a hierarchical simulator according to an embodiment of the present invention.

FIG. 4 illustrates a dynamic partitioning method in a hierarchical simulator according to an embodiment of the present invention. The method examines the strength of coupling between partitions and identifies an efficient arrangement of the corresponding matrices for computation. For example, partition 1 represented by the matrix 402, partition 3 represented by the matrix 406, and partition 4 represented by the matrix 404 are loosely coupled when a transistor represented by the matrix 406 is off initially. Assuming that during simulation, if the transistor (partition 3) is turned on, which causes partitions 1 and 4 to become closely coupled to each other, then a dynamic partitioning may be performed on the partitions and new matrices are formed. The partitions 1, 3 and 4 are grouped together to form a new matrix 412. By grouping the partitions 1, 3, and 4 together, communications between them are handled within the same matrix. As a result, the number of computational iterations is reduced because the matrices for partitions 1, 3, and 4 are solved in the same matrix 412. Hence, the overall simulation performance is improved because fewer computational iterations are required to reach a converged solution.

Note that in another period of the simulation, if the partitions 1, 3 and 4 may become loosely coupled, the simulator regroups the partitions and separates the matrix 412 into individual matrices 402, 404 and 406 respectively.

When two or more partitions are connected to the same bus node, then the ON/OFF state of the switch element (which connects the partition to the bus node) determines the coupling strength between the different partitions. If both partitions connect to the bus node through an ON switch, then they are strongly coupled. On the other hand, if one of the switches is OFF, then they are considered as loosely coupled. So the dynamic partition has a run-time overhead to check the ON/OFF states of the switch element. If the bus node connects to a large number of small partitions through a large number of switches, the run-time checking of switch ON/OFF states may dominate the simulation time.

If a large number of small partitions connect to the same bus node through resistors, then they are merged into one single matrix when viewed dynamically, although these partitions are considered separate when viewed statically. This is because the coupling between them is always strong due to the fact that a resistor is always ON as a switch. In this situation, the resistor switches are merged together in the beginning, therefore saving the run time overhead of dynamically checking the ON/OFF states of these resistor switches.

The method for performing the on-switch partition-merging is as follows: 1) start from a bus node and find each resistor connected to that bus node, 2) find the resistor's other terminal node and its partition; 3) find all resistor switch partitions; and 4) merge them into one single partition.

In yet another embodiment, since the dynamic partition has a run-time overhead of checking the ON/OFF states of the switch to determine whether or not we merge the small partitions into a single matrix, sometimes, if the partitions connected through MOSFET are so tiny that the all combined larger matrix is still reasonably small, then the overhead checking time dominates the matrix solving time, and the simulation goes faster if all the partitions are merged together in the beginning.

The method for performing the MOS-switch partition-merging is as follows: 1) start from a bus node and find each MOSFET channel-connected to that bus node; 2) find the MOSFET's other channel-connected terminal node and its partition; 3) find all the MOS-switch partitions; and 4) if the size of all combined partitions is smaller than some empirical threshold, merge them into one single partition.

In yet another embodiment, a method for performing bus partition-merging is described. In a hierarchical simulator, all circuits are residing in a hierarchy. If one of the input ports of the circuit is a bus node, and the higher level circuit in the hierarchy is larger than some empirical threshold, then the overhead time of checking ON/OFF states of switch element dominates the matrix solving time, and the simulation may go faster when the partitions are merged together in the beginning. The steps for identifying bus nodes and performing partition-merging are described below.

Pre-process-I: determine a bus partition set: start from the bus input port node of the circuit, find each channel-connected (CC) element's other terminal node and that node's partition, then insert that partition into the bus partition set. For example, when a circuit has a non-empty bus partition set, then the circuit has at least one bus input port node, and the higher level circuit is larger than the empirical threshold. Furthermore, each partition in the bus partition set is channel-connected to a bus input port node.

Pre-process-II: for each partition in the bus partition set, add a graph edge between the partition and each of its input nodes' partitions if the input node's partition is also in the bus partition set. In other words, two partition vertices have graph edges between them if and only if both partitions are channel-connected to the bus input port node.

Finally, the merging process takes place in the base class: build forest, merge all the partitions in each tree into a single yet larger partition. The topologically-connected clusters of partitions that are channel-connected to any input port bus node are merged into one single partition.

In yet another embodiment, a method for identifying receiver-driver coupling and performing partition-merging is described. For two partitions (circuits) to be considered as electrically isomorphic, they need to have 1) a substantially same set of input signals that are received by the two partitions; 2) a substantially same set of internal topologies, internal states, and external loads that are observed by the two partitions; and 3) a substantially same set of output signals that are produced within a predetermined threshold of signal tolerance by the two partitions in response to the substantially same set of input signals.

Figure 5:
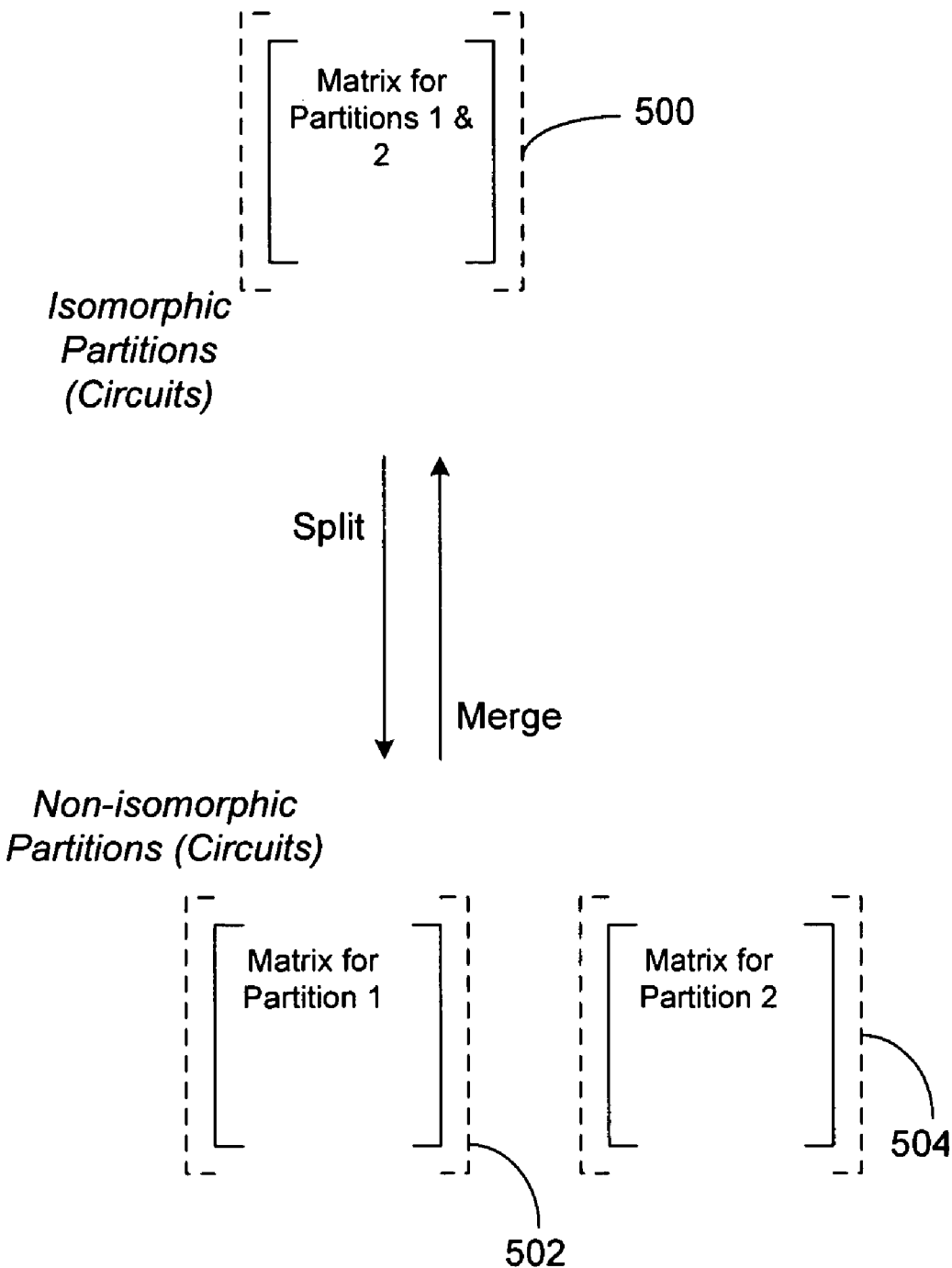
FIG. 5 illustrates a method for performing receiver-driver partitioning-merging according to an embodiment of the present invention.

FIG. 5 illustrates an example of receiver-driver partition-merging according to an embodiment of the present invention. Prior to the start of a simulation, if two substantially the same partitions 1 and 2 which demonstrate substantially the same isomorphic behavior, they are merged and represented by a single matrix 500. During certain period of the simulation, if the partitions 1 and 2 diverge from each other and demonstrate substantially different isomorphic behavior, then a split operation is performed on the partition represented by the matrix 500 to separate it into two individual partitions represented by the matrices 502 and 504 respectively. Note that two partitions are deemed to have substantially different isomorphic behavior if 1) a substantially different set of input signals are received by the two partition; 2) a substantially different set of internal topologies, internal states and external loads are observed by the two partitions; or 3) a substantially different set of output signals are produced within a predetermined threshold of signal tolerance by the two partitions in response to a substantial same set of input signals. During another period of the simulation, if the isomorphic behavior of the partition 1 and 2 converge to each other and demonstrate substantially the same isomorphic behavior again, a merge operation is performed to combine the two individual partitions represented by the matrices 502 and 504 respectively into a single partition represented by the matrix 500. This process of isomorphic partitioning minimizes the number of partitions used to represent the design during simulation and hence minimizes the corresponding computation of the partitions when such partitions demonstrate substantially the same isomorphic behavior.

The process for performing receiver-driver partition-merging is as follows: if a partition has a higher accuracy requirement, it is merged with all other partitions that drive it. The underlying reason is that the accuracy of simulation would be lower if the receiver and driver are separated, and may fail to meet the higher accuracy requirement. The steps for identifying receiver-driver coupling and performing partition-merging are described below.

Pre-Process I: use a graph algorithm to build up a receiver-driver coupled forest: 1) add an edge between any two partitions if they have a driver-receiver relationship; 2) form a forest; 3) each tree (or a cluster of partition) in the forest is called a receiver-driver coupled partition set.

Pre-Process II: for each receiver-driver coupled partition set, 1) divide it into several subset of partitions such that all the partitions in each subset are topologically connected, while any two partitions in different subsets are topologically isolated from each other. This subset is called a receiver-driver coupled partition-merging subset. Finally, the merging process takes place in the base class to merge all the partitions in the receiver-driver coupled partition-merging subset into a single partition.

In yet another embodiment, a method for performing float partition-merging is described. A float partition contains elements only, and it doesn't have any node. It performs the function of a garbage collector that collects all the elements that do not strongly connect to any other partitions. In a float partition, an element is isolated from other portions of the circuit. The float partition-merging process let the element's terminal node's partition merge in the element, and thus improves the accuracy of the simulation.

The steps for performing float partition-merging are as follows: for each element in the float partition, if all non-voltage type terminals of that element belong to the same partition (which is not a float partition since it contains at least one node), then that element is retrieved from the original float partition, and is then pushed into the partition that contains the terminal node. Upon completing the above process, if the original float partition becomes empty, then that partition is removed.

In yet another embodiment, a method for performing float capacitor partition-merging is described. The process is as follows: any float capacitor partition has only one capacitor and does not contain any node at all. If the two terminal nodes of the capacitor in the float capacitor partition belong to the same partition (which is not a float capacitor partition since it contains at least one node), then the capacitor is pushed into that partition, and the original float capacitor partition is removed.

In yet another embodiment, a method for partitioning an integrated circuit employs a two-step approach. The first step identifies circuit partitions using a digital partitioning technique. The second step merges the partitions identified in the first step together for achieving improved accuracy and stability of simulation.

Figure 6:
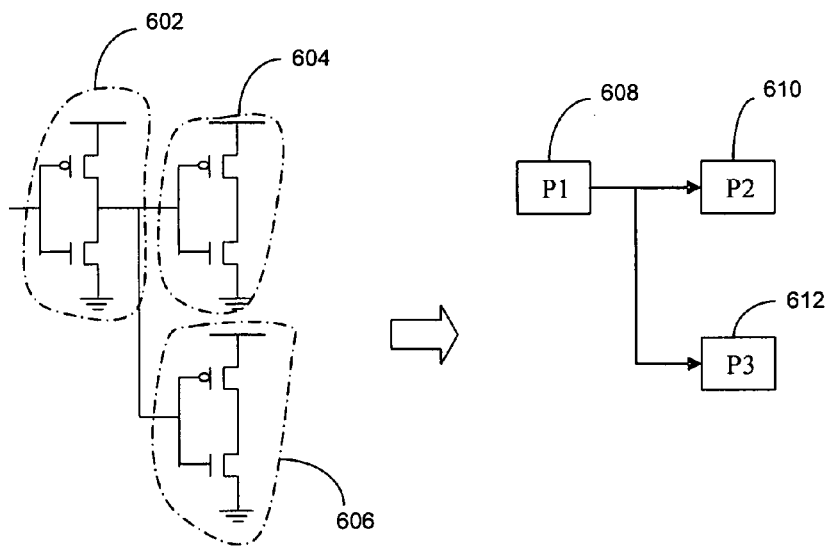
FIG. 6 illustrates a method of channel partitioning according to an embodiment of the present invention.

This step of digital partitioning employs the technique of channel partitioning. FIG. 6 illustrates a method of channel partitioning according to an embodiment of the present invention. A typical integrated circuit contains thousands or millions of elements and nodes. The coupling between different parts of a circuit is a main factor for determining the circuit partitions for the circuit. Analog and mixed signal circuits often have complicated coupling due to many different physical effects in the design. The coupling is typically not constant, as it changes during simulation. A circuit partitioning process breaks the integrated circuit into many smaller blocks, which are commonly referred to as partitions. A partition includes its corresponding elements and nodes within the partition. Two or more partitions connect to each other through ports. A partition may have two types of ports, namely input ports and output ports. An output port may connect to input ports of downstream partitions that are driven by the output port. During partitioning, each node or element is assigned to a particular partition. If the assigned node is also a port of the partition, that implies the assigned node is an output port. If a port is not an assigned node of the partition, it is input port. Fast SPICE simulator uses an approximation method for port node simulation. The accuracy of the approximation depends on the accuracy of the partitioning process. Most digital circuits are insensitive to partitioning. As circuits become more complicated or require high accuracy, partitioning needs to be more conservative in order to make the approximation in simulation acceptable.

As shown in FIG. 6, a three-inverter circuit, containing a first inverter 602, a second inverter 604, and a third inverter 606, is used for this example. The coupling between the first and second inverters is nearly unidirectional. Similarly, the coupling between the first and third inverters is also nearly unidirectional. The result of the channel partitioning produces three circuit partitions, namely P1 608, P2 610, and P3 612 for the first inverter 602, second inverter 604, and third inverter 606 respectively. The first inverter 602 controls the behavior of the second inverter 604 and the second inverter 604 produces a loading effect for the first inverter 602. If the loading doesn't change during simulation, it is deemed to be unidirectional coupling. However, in practice, the loading due to the second inverter does change because of changes of the states of the second inverter. This loading change affects the simulation result of the first inverter. The conventional Fast SPICE simulator may approximate this change of loading to the first inverter 602 to some extent. But if the feedback coupling is strong, it does not produce accurate simulation results and numerical stability. The disclosed invention addresses this issue of the Fast SPICE.

Figure 7:
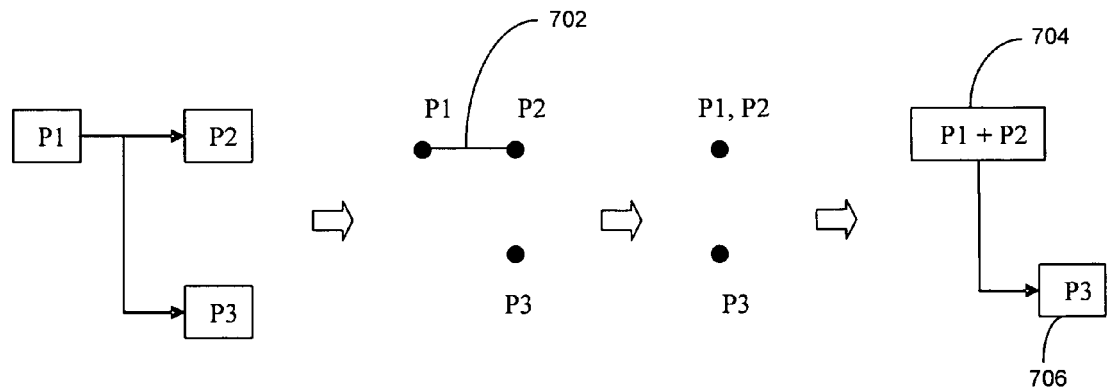
FIG. 7 illustrates a graph of the three-inverter circuit of FIG. 6 according to an embodiment of the present invention.

The step of digital partitioning produces a graph with vertices, where each vertex represents a partition. A graph is used to represent the relationships between partitions in terms of how the partitions may be communicated to each other and how the partitions may be grouped together. In the graph, each partition is represented by a vertex, and the edge (line) between two vertices indicates that the two partitions represented by two vertices may be merged into one partition. FIG. 7 illustrates a graph of the three-inverter circuit of FIG. 6 according to an embodiment of the present invention. In this example, partitions P1 and P2 are identified as having substantial correlations, in this case strong coupling, and an edge 702 is used to link the two vertices P1 and P2. After merging, P1 and P2 become a new partition (P1+P2) 704, and the partition P3 706 remains a stand-alone partition.

As discuss above, the channel partitioning technique may be used as a base for initial partitioning. In another embodiment, a more aggressive approach, such as adaptive partitioning, may be used to further divide large circuit partitions into smaller circuit partitions. Note that other partitioning approaches may also be employed.

This digital partitioning approach may benefit from adaptive partitioning. During the digital partitioning step, initial adaptive partitioning may be performed at the same time. Since all circuit partitions are to be examined for merging, the initial adaptive partitioning may be made more aggressive without hurting accuracy of the simulation.

If two partitions have direct and strong coupling to each other, the two partitions are deemed to have substantial correlations between each other, and it is preferable to combine them together for simulation accuracy and for stability of the simulation. For example, partition A drives partition B, and partition B has a large capacitor between its input and its internal nodes. This means partition B may have a strong coupling effect on partition A if the capacitor is large. Other forms of direct strong bi-directional coupling may exist between nearby circuitry in other complex circuit designs. A voltage-controlled current source MOSFET gate leakage current model is an example that demonstrates strong bi-directional coupling with nearby circuitry. After two partitions are identified to have strong bi-directional coupling, an edge is added between the corresponding vertices in the graph that describes the partitions.

Figure 8:
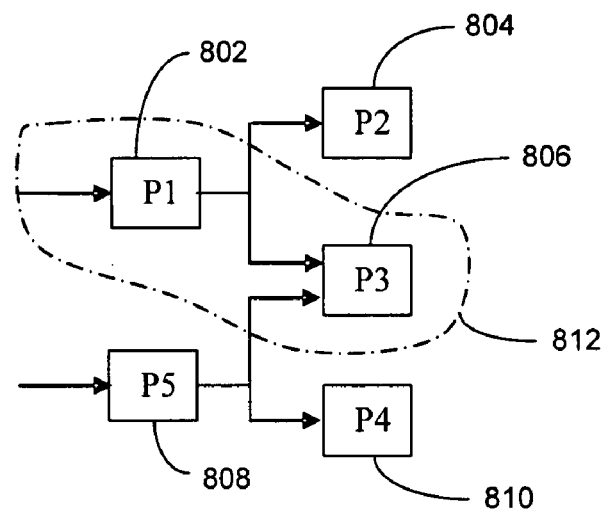
FIG. 8 illustrates a method of identifying sensitive receivers among partitions according to an embodiment of the present invention.

In some embodiments, it is necessary to merge two partitions together even if the two partitions exhibit only unidirectional coupling. For example, partition A drives partition B, and there is no feedback path from partition B to partition A. However, if partition B is highly sensitive to the output of partition A, it is preferable to combine these two partitions together for better simulation accuracy. For example, a chain of amplifiers that produce a sinusoidal signal should not be broken into separate partitions for a Fast SPICE simulation. FIG. 8 illustrates a method of identifying sensitive receivers among partitions according to an embodiment of the present invention. As shown in FIG. 8, partition P1 802 drives partition P2 804 and partition P3 806, and partition P5 808 drives partition P3 806 and partition P4 810. Partition P3 806 has two input ports, and one of the input ports is sensitive to the output of partition P1 802, while the other input port of partition P3 806 is not sensitive to the output of partition P5 808. In this scenario, partition P1 802 and partition P3 806 are deemed to have substantial correlations and these two partitions are combined as a new partition 812 (as shown by the dotted line) for Fast SPICE simulation.

Figure 9:
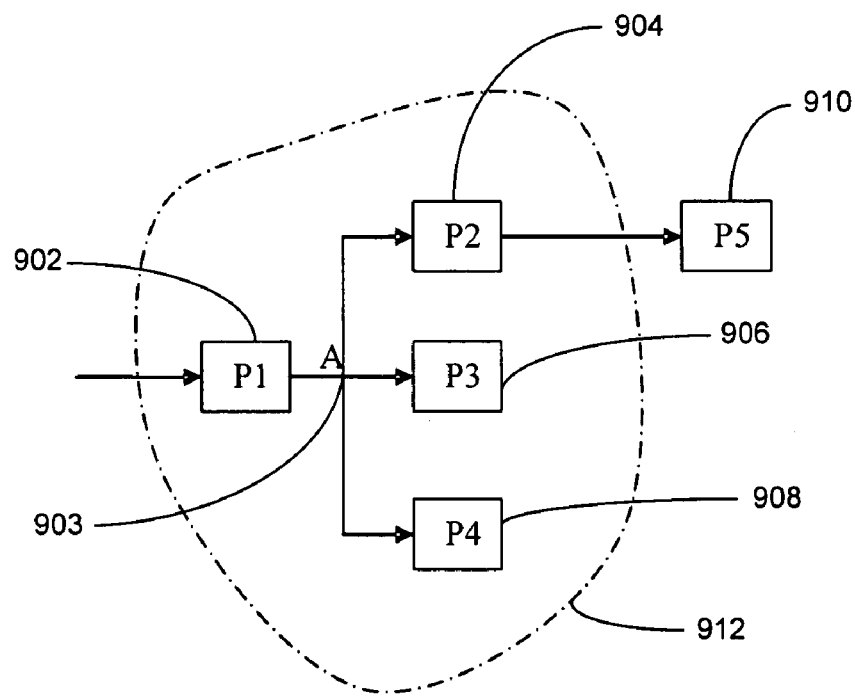
FIG. 9 illustrates a method of identifying a high accuracy node according to an embodiment of the present invention.

In other embodiments, certain nodes in a circuit may be of particular importance and the simulation needs to be highly accurate. FIG. 9 illustrates a method of identifying a high accuracy node according to an embodiment of the present invention. As shown in FIG. 9, partition P1 902 drives partitions P2 904, P3 906, and P4 908, and partition P2 904 in turn drives partition P5 910. Node A 903 is the node between the output of partition P1 and the inputs of partitions P2, P3, and P4. In this example, node A 903 is required to be highly accurate. In order to meet this requirement, partitions P1, P2, P3, and P4 are deemed to have substantial correlations, and they are combined to encompass the highly accurate node A and form a new partition 912 (shown as dotted line). As a result, edges may be added between the vertex of P1 to P2, P3, and P4 respectively to indicate these four partitions are to be merged.

Figure 10A:
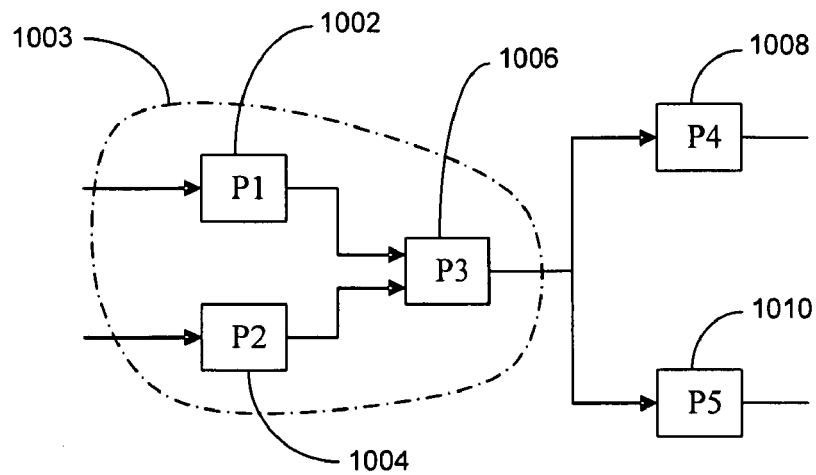
FIG. 10A illustrates a method of identifying a buffer layer to a highly accurate circuit partition according to an embodiment of the present invention.

In yet another embodiment, a circuit partition that requires high accuracy often calls for a more conservative partitioning technique. FIG. 10A illustrates a method of identifying a buffer layer to a highly accurate circuit partition according to an embodiment of the present invention. As shown in FIG. 10A, partition P1 1002 and partition P2 1004 drive partition P3 1006. Partition P3 1006 in turn drives partition P4 1008 and partition P5 1010. Partition P3 1006 may be a highly accurate circuit partition. In this scenario, partitions P1, P2, and P3 are deemed to have substantial correlations, and it is preferable to combine the buffer layer of partition 3, which includes partition 1 1002 and partition 2 1004 in this example, as a new partition 1005 (indicated by the dotted line) for simulation.

Figure 10B:
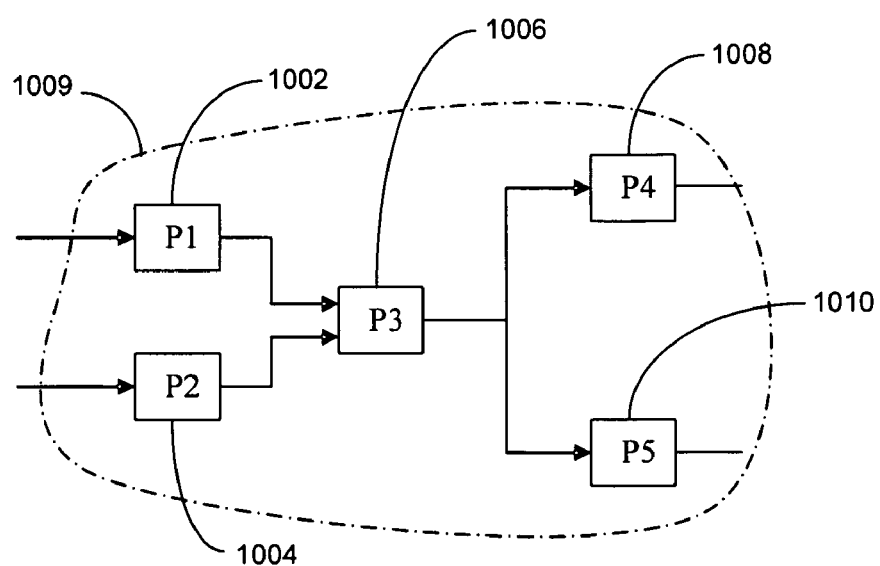
FIG. 10B illustrates a method of identifying a buffer layer surrounding a highly accurate circuit partition according to an embodiment of the present invention.

In yet another approach, it is preferable to merge neighbor partitions surrounding a high accuracy partition. FIG. 10B illustrates a method of identifying a buffer layer surrounding a highly accurate circuit partition according to an embodiment of the present invention. FIG. 10B is similar to FIG. 10A, except that the surrounding buffer layer of the highly accurate circuit partition P3 1006 also includes partition 4 1008 and partition 5 1010. In other words, the components of surrounding buffer layer of the highly accurate circuit partition, including partitions P1, P2, P4, and P5, are deemed to have substantial correlations to the partition P3. This approach is more conservative than the method described in FIG. 10A. The new partition 1009 includes all neighbor partitions of the partition P3, such as P1, P2, P4 and P5. In other words, all input nodes to the circuit partition P3 are deemed to be sensitive and all its output nodes are conservative. In other embodiments, more than one buffer layer may be combined with the circuit partition P3 1006 to form a new partition.

In some embodiments, a circuit partition may experience strong feedback from other circuit partitions. FIG. 11A illustrates a circuit with a feedback loop according to an embodiment of the present invention. As shown in FIG. 11A, partition P1 1102 drives partition P2 1104, which in turn drives partition P5 1106. In addition, there is a feedback loop from the output of partition 2 1104 back to one of the inputs of partition 1 1102. This is a short feedback loop that binds partition 1 and partition 2 together. In general, a feedback loop having a short feedback path is usually harmful to the simulation accuracy and stability. Thus, partitions P1 and P2 are deemed to have substantial correlations and they are combined to form a new partition 1005 (shown as dotted line).

FIG. 11B illustrates a circuit with a different feedback loop according to an embodiment of the present invention. FIG. 11B is similar to FIG. 11A, except there are partition P3 1108 and partition P4 1110 in the feedback loop. This feedback loop is longer than the one shown in FIG. 11A. In general, a feedback loop having a long feedback path is usually not harmful to the simulation accuracy and stability. However, if the circuit partitions P3 and P4 in the feedback path affect the circuit partitions P1 and P2 in the forward path, these four circuit partitions are deemed to have substantial correlations, and they may be combined to form a new circuit partition 1009 (shown as dotted line).

In yet another embodiment, arbitrary circuit partitions may be combined to form a new circuit partition. These circuit partitions may not physically connect to each other, either directly or indirectly, but substantial correlations still exist between the partitions. In certain situations, it may be necessary to combine these circuit partitions into a new circuit partition. For example, a designer may want to conduct high accuracy post processing of waveforms of voltage difference, such as Fast Fourier Transformation (FFT) analysis, between two nodes in two unconnected circuit partitions. Thus, it is preferable to combine the two unconnected circuit partitions into one circuit partition for simulation, which would produce higher accuracy in simulation.

Note that the approaches described above may be applied independently to identify circuit partitions for merging, which may be graphically illustrated as edges between vertices in a graph.

After Step 2, a group of graphs is generated. FIG. 12 illustrates a graphical representation of merging a group of graphs to their corresponding circuit partitions according to an embodiment of the present invention. As shown in FIG. 12, on the left hand side, there are three graphs. The first graph includes the vertices P5, P6, P7, P8, and P9. The second graph includes the vertices P2, P3, and P4, and the third graph includes only the vertex P1. From the group of graphs, a corresponding group of minimum spanning trees is generated using a depth-first search method. The group of minimum spanning trees is illustrated in the middle of FIG. 12. Note that a minimum spanning tree has no loop. Each circuit partition is represented by a vertex in a minimum spanning tree. All vertices in a minimum spanning tree are circuit partitions to be merged together. The first spanning tree includes the vertices P5, P6, P7, P8, and P9. The second spanning tree includes the vertices P2, P3, and P4, and the third spanning tree includes only the vertex P1.

The edges in a graph are followed to identify all circuit partitions within a minimum spanning tree to be combined together to form a new circuit partition. On the right hand side of FIG. 12, after all the circuit partitions in a minimum spanning tree have been merged, there are only three partitions, namely a first partition that includes previous circuit partitions P5, P6, P7, P8, and P9. A second partition includes the previous circuit partitions P2, P3, and P4; and a third partition includes the previous circuit partition P1.

In one embodiment, an example of the pseudo code for implementing the present invention is listed below.

```
int DB_Partitioner::staticPart( )
{
//channel partitioning to create base partitions
ccPart( );
//instantiate merge registry;
DB_PartMergeRegistry mergeReg;
//Identify partitions to be merged and register them in the mergeReg
{
//Identify two types of direct strong bidirectional coupling:
//strong capacitive coupling between partitions and
//back-to-back cross-coupling such as latches
capPartAddEdge(mergeReg);
gatePartAddEdge(mergeReg);
//Sensitive receivers: dependent elements and smooth
    source elements
//like sinusoidal sources are considered sensitive
depPartAddEdge(mergeReg);
senSrcPartAddEdge(mergeReg);
//Accurate node
accPartAddEdge(mergeReg);
//Add buffer layer for special partitions like those with
    behavioral models
bufPartAddEdge(mergeReg);
//Forced merging
forcePartAddEdge(mergeReg);
//Identify strong feedback loop and add edge
sccPartAddEdge(mergeReg);
}
//use DFS to traverse the whole registry to find partition groups
mergeReg.constuctGroups( )
//Actual partition merge, all partitions in one group are merged together
doMerge(mergeReg.getGroups( ));
}
```

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The invention can be implemented in any suitable form including hardware, software, firmware or any combination of these. The invention may optionally be implemented partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. A method for preparing a circuit for simulation, comprising:
    receiving a netlist representation of the circuit comprising circuit components;
    partitioning the circuit to form one or more circuit partitions according to a predefined partitioning method, wherein each circuit partition includes one or more circuit components, by using a computer;
    for each circuit partition, identifying substantial correlations between the circuit partition and one or more other circuit partitions to form a spanning tree, wherein the spanning tree connects the circuit partition to the one or more other circuit partitions via a graph, and wherein identifying substantial correlations includes identifying strong bi-directional coupling between the circuit partition and the one or more other circuit partitions, and identifying strong unidirectional coupling between the circuit partition and the one or more other circuit partitions during simulation; and
    merging the circuit partition and the one or more other circuit partitions having identified substantial correlations in the spanning tree to form a new circuit partition.

2. The method of claim 1, further comprising:
    performing a Fast SPICE simulation of the circuit using the new circuit partition.

3. The method of claim 1, wherein partitioning the circuit further comprising:
    dividing the one or more circuit partitions into smaller circuit partitions using an adaptive circuit partitioning method.

4. The method of claim 1, wherein the predefined partitioning method is a channel partitioning method.

5. The method of claim 1, wherein identifying substantial correlations further comprises:
    identifying sensitive receivers of the circuit partition from the one or more other circuit partitions.

6. The method of claim 1, wherein identifying substantial correlations further comprises:
    identifying high accuracy nodes between the circuit partition and the one or more other circuit partitions.

7. The method of claim 1, wherein identifying substantial correlations further comprises:
identifying a buffer layer before or after the circuit partition, wherein the one or more other circuit partitions form the buffer layer.

8. The method of claim 1, wherein identifying substantial correlations further comprises:
identifying a strong feedback loop formed by the circuit partition and the one or more other circuit partitions.

9. The method of claim 1, wherein identifying substantial correlations further comprises:
identifying two partitions that do not connect to each other.

10. A system for preparing a circuit for simulation, comprising:
at least one processing unit for executing computer programs;
a graphical-user-interface for viewing representations of the integrated circuit on a display;
a memory for storing information of the integrated circuit;
logic for receiving a netlist representation of the circuit comprising circuit components;
logic for partitioning the circuit to form one or more circuit partitions according to a predefined partitioning method, wherein each circuit partition includes one or more circuit components;
for each circuit partition, logic for identifying substantial correlations between the circuit partition and one or more other circuit partitions to form a spanning tree, wherein the spanning tree connects the circuit partition to the one or more other circuit partitions via a graph, and wherein the logic for identifying substantial correlations includes logic for identifying strong bi-directional coupling between the circuit partition and the one or more other circuit partitions, and logic for identifying strong unidirectional coupling between the circuit partition and the one or more other circuit partitions during simulation; and
logic for merging the circuit partition and the one or more other circuit partitions having identified substantial correlations in the spanning tree to form a new circuit partition.

11. The system of claim 10, further comprising:
logic for performing a Fast SPICE simulation of the circuit using the new circuit partition.

12. The system of claim 10, wherein the logic for partitioning the circuit further comprising:
logic for dividing the one or more circuit partitions into smaller circuit partitions using an adaptive circuit partitioning method.

13. The system of claim 10, wherein the predefined partitioning method is a channel partitioning method.

14. The system of claim 10, wherein the logic for identifying substantial correlations further comprises:
logic for identifying sensitive receivers of the circuit partition from the one or more other circuit partitions.

15. The system of claim 10, wherein the logic for identifying substantial correlations further comprises:
logic for identifying high accuracy nodes between the circuit partition and the one or more other circuit partitions.

16. The system of claim 10, wherein the logic for identifying substantial correlations further comprises:
logic for identifying a buffer layer before or after the circuit partition, wherein the one or more other circuit partitions form the buffer layer.

17. The system of claim 10, wherein the logic for identifying substantial correlations further comprises:
logic for identifying a strong feedback loop formed by the circuit partition and the one or more other circuit partitions.

18. The system of claim 10, wherein the logic for identifying substantial correlations further comprises:
logic for identifying two partitions that do not connect to each other.

19. A computer program product, comprising a non-transitory computer readable medium storing programs for execution by one or more computer systems, the computer program product comprising:
a circuit partition module for preparing a circuit for simulation, wherein the circuit partition module is used in conjunction with at least a microprocessor unit, a memory, and a user interface, and the circuit partition module includes one or more computer programs containing:
code for receiving a netlist representation of the circuit comprising circuit components;
code for partitioning the circuit to form one or more circuit partitions according to a predefined partitioning method, wherein each circuit partition includes one or more circuit components;
for each circuit partition, code for identifying substantial correlations between the circuit partition and one or more other circuit partitions to form a spanning tree, wherein the spanning tree connects the circuit partition to the one or more other circuit partitions via a graph, and wherein the code for identifying substantial correlations includes code for identifying strong bi-directional coupling between the circuit partition and the one or more other circuit partitions, and code for identifying strong unidirectional coupling between the circuit partition and the one or more other circuit partitions during simulation; and
code for merging the circuit partition and the one or more other circuit partitions having identified substantial correlations in the spanning tree to form a new circuit partition.

20. The computer program product of claim 19, further comprising:
code for performing a Fast SPICE simulation of the circuit using the new circuit partition.

21. The computer program product of claim 19, wherein the code for partitioning the circuit further comprising:
code for dividing the one or more circuit partitions into smaller circuit partitions using an adaptive circuit partitioning method.

22. The computer program product of claim 19, wherein the predefined partitioning method is a channel partitioning method.

23. The computer program product of claim 19, wherein the code for identifying substantial correlations further comprises:
code for identifying sensitive receivers of the circuit partition from the one or more other circuit partitions.

24. The computer program product of claim 19, wherein the code for identifying substantial correlations further comprises:
code for identifying high accuracy nodes between the circuit partition and the one or more other circuit partitions.

25. The computer program product of claim 19, wherein the code for identifying substantial correlations further comprises:
code for identifying a buffer layer before or after the circuit partition, wherein the one or more other circuit partitions form the buffer layer.

26. The computer program product of claim 19, wherein the code for identifying substantial correlations further comprises:

code for identifying a strong feedback loop formed by the circuit partition and the one or more other circuit partitions.

27. The computer program product of claim 19, wherein the code for identifying substantial correlations further comprises:

code for identifying two partitions that do not connect to each other.

\* \* \* \* \*